United States Patent
Caous et al.

(10) Patent No.: US 10,444,271 B2
(45) Date of Patent: Oct. 15, 2019

(54) DEVICE FOR MONITORING AN ELECTRICAL CONDUCTOR AND ELECTRICAL INSTALLATON COMPRISING SUCH A DEVICE

(71) Applicant: Schneider Electric Industries SAS, Rueil Malmaison (FR)

(72) Inventors: Philippe Caous, Villemoirieu (FR); Pascal Cumunel, Chassieu (FR); Stephane Pollo, Nievroz (FR)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 278 days.

(21) Appl. No.: 15/193,296

(22) Filed: Jun. 27, 2016

(65) Prior Publication Data

US 2017/0074917 A1  Mar. 16, 2017

(30) Foreign Application Priority Data

Sep. 10, 2015  (FR) ...................................... 15 58399

(51) Int. Cl.
*G01R 31/02* (2006.01)
*G01R 15/16* (2006.01)
(Continued)

(52) U.S. Cl.
CPC .......... *G01R 31/021* (2013.01); *G01R 15/16* (2013.01); *G01R 15/06* (2013.01); *G01R 15/142* (2013.01)

(58) Field of Classification Search
CPC ...... G01R 31/021; G01R 15/16; G01R 15/06; G01R 15/142
See application file for complete search history.

(56) References Cited

U.S. PATENT DOCUMENTS

| 4,700,123 A | 10/1987 | Beling |
| 4,963,819 A | 10/1990 | Clarke et al. |

(Continued)

FOREIGN PATENT DOCUMENTS

| EP | 0 172 634 A1 | 2/1986 |
| EP | 2 857 848 A1 | 4/2015 |

(Continued)

OTHER PUBLICATIONS

French Preliminary Search Report dated May 9, 2016 in French Application 15 58399, filed Sep. 10, 2015 (with English Translation of Categories of Cited Documents).

*Primary Examiner* — Jeff W Natalini
(74) *Attorney, Agent, or Firm* — Oblon, McClelland, Maier & Neustadt, L.L.P.

(57) ABSTRACT

The monitoring device for an electrical line conductor and including a protective housing, an attachment mechanism, an electronic monitoring circuit and a voltage measurement sensor including a measurement electrode. The monitoring device also includes a protection device surrounding the voltage measurement electrode and extending outside the housing to prevent rainwater from completely covering the voltage measurement electrode and/or the housing containing said electrode. The protection device includes an electrical shielding for stabilizing, around the voltage measurement electrode, the electric field variations due to external conditions. The electrical installation includes at least one line conductor and at least one monitoring device communicating with a communication device.

12 Claims, 6 Drawing Sheets

(51) Int. Cl.
*G01R 15/06* (2006.01)
*G01R 15/14* (2006.01)

(56) References Cited

U.S. PATENT DOCUMENTS

| | | | | |
|---|---|---|---|---|
| 5,565,783 | A * | 10/1996 | Lau | G01R 15/142 |
| | | | | 324/127 |
| 5,991,141 | A * | 11/1999 | Mikli | H01C 7/12 |
| | | | | 361/117 |
| 6,677,743 | B1 | 1/2004 | Coolidge et al. | |
| 9,664,710 | B2 * | 5/2017 | Roberson | G01R 15/142 |
| 9,739,804 | B2 * | 8/2017 | Busemann | G01R 15/16 |
| 2010/0283487 | A1 * | 11/2010 | Juds | G01R 15/16 |
| | | | | 324/688 |
| 2011/0011623 | A1 * | 1/2011 | Hyde | H01B 17/525 |
| | | | | 174/139 |
| 2016/0209447 | A1 | 7/2016 | Caous | |

FOREIGN PATENT DOCUMENTS

| | | |
|---|---|---|
| FR | 3 026 488 A1 | 4/2016 |
| FR | 3 031 812 A1 | 7/2016 |
| WO | WO 00/52483 A1 | 9/2000 |

\* cited by examiner

DEVICE FOR MONITORING AN ELECTRICAL CONDUCTOR AND ELECTRICAL INSTALLATON COMPRISING SUCH A DEVICE

TECHNICAL FIELD

The invention relates to a monitoring device intended to be arranged on an electrical line conductor and comprising:
- a protective housing,
- a mechanism for attaching said housing to the line conductor,
- an electronic monitoring circuit, and
- a voltage measurement sensor comprising a measurement electrode connected to said electronic circuit.

The invention also relates to an electrical installation comprising at least one line conductor, at least one monitoring device arranged on said line conductor.

PRIOR ART

A diagram of a known line monitoring device, intended for medium-voltage or high-voltage overhead lines is shown in FIG. 1. This monitoring device 1 comprises a housing 2 comprising an electronic monitoring circuit 3 and a voltage measurement sensor comprising a measurement electrode 4 connected to said electronic circuit.

The electronic circuit 3 also comprises an input connected to a current sensor 5. The current sensor generally comprises a current transformer comprising a magnetic circuit and a secondary winding connected to the electronic circuit 3. The magnetic circuit is intended to surround a line conductor forming the primary conductor. In the example shown in FIG. 1, the electronic circuit comprises a processing unit 7 receiving a voltage signal converted by a first analog-digital converter 8 connected to the voltage electrode 4 and to the line conductor 6. A current signal I is also received by the unit 7 and converted by a second analog-digital converter 9 connected to the current sensor 5. The processing unit 7 is also connected to a memory 10, optionally to a communication antenna 11 and/or to a remote display device 12. The processing unit analyzes the voltage signals V and/or current signals I in order to detect and/or indicate the direction of the electrical faults, calculate the power or energy values and/or transmit measurement and processing values to a remote communication device 13.

Generally, the housing 2 is fixed onto the line conductor 6 by an attachment device 14.

The monitoring devices are generally arranged on medium-voltage or high-voltage lines, one per phase on three-phase lines. The current detection is measured by the detection of a magnetic field around the conductor 6 while the voltage detection and/or measurement is performed by the detection of an electric field between the conductor and the earth or the ground with the measurement electrode 4. The electrode 4 for measuring the electric field is subject to the influence of the conductor 6 and the earth as well as the influence of the other conductors in the case of three-phase lines. The influence of the neighbouring lines is taken into account during determination of the voltage value. The voltage measurement electrode 4 is generally an independent metal plate connected to the electronic circuit or a part of a layer of a printed circuit of the electronic circuit 3.

Since the housings 2 of the monitoring devices are used externally, they are exposed to the climatic conditions and in particular bad weather. Consequently, in the event of heavy rain, in particular during stormy or monsoon seasons, a film of water 15 forms around the housing. As shown in FIG. 2, this film of water disturbs the electric field around the housing and the measurement electrode 4 which is inside the housing. The voltage measurement is therefore disturbed and in extreme cases the voltage measurement or the detection of the presence/absence of voltage is no longer possible.

Moreover, when the voltage detection is associated with the current measurement, the detection or the validation of electrical faults may be falsified. The device may thus suffer from malfunctioning due to the severe meteorological or climatic conditions.

SHORT DESCRIPTION OF THE INVENTION

The aim of the invention is to provide a monitoring device allowing electric voltage measurements which are less sensitive to rain and more generally to climatic conditions.

According to the invention the monitoring device is intended to be arranged on an electrical line conductor and comprises:
- a protective housing,
- a mechanism for attaching said housing to the line conductor,
- an electronic monitoring circuit, and
- a voltage measurement sensor comprising a measurement electrode connected to said electronic circuit, and comprises a protection device surrounding the voltage measurement electrode and extending outside of the housing to prevent the rainwater from completely covering the voltage measurement electrode and/or the housing containing said electrode, said protection device comprising an electrical shielding for stabilizing, around the voltage measurement electrode, the electric field variations due to external conditions.

Preferably, the electrical shielding is deposited by metal-coating at least one part of the protection device. Advantageously, the electrical shielding is intended to be electrically connected to the line conductor by means of the attachment mechanism.

Preferably, the protection device consists of at least one skirt arranged on the protective housing and having an outer perimeter greater than the perimeter of the housing and a height greater than the height of the voltage measurement electrode. Advantageously, the protection device has the form of a substantially circular or frustoconical skirt. According to a variant, the protection device comprises at least two skirts with different shapes, arranged at different points on the protective housing.

In a particular embodiment, the protection device comprises:
- a first skirt having a first outer perimeter and first inner perimeter arranged so that said inner perimeter is situated above the position of the voltage measurement electrode and the outer perimeter is situated below the position of said electrode, and
- a second skirt arranged below the first skirt and having an outer perimeter smaller than the perimeter of the first skirt.

Advantageously, the protection device comprises at least one shoulder or step for preventing water from rising back up inside said protection device. Preferably, the protection device is formed by at least two parts intended to be assembled around the protective housing.

Preferably, the monitoring device comprises a current measurement sensor comprising a magnetic circuit and a secondary winding connected to the processing circuit, said magnetic circuit being associated with the mechanism for attaching the housing to the line conductor.

Preferably, the device comprises wireless communication means and/or visual signalling means connected to said processing unit of the electronic monitoring circuit.

In an electrical installation according to the invention comprising at least one line conductor and at least one monitoring device arranged on said line conductor, said monitoring device is a monitoring device such as that defined above. Preferably, the electrical installation comprises at least one wireless communication device, said monitoring device being intended to communicate with said communication device.

BRIEF DESCRIPTION OF THE DRAWINGS

Other advantages and characteristic features will emerge more clearly from the description which follows of particular embodiments of the invention, provided by way of non-limiting example and illustrated in the attached drawings in which.

DETAILED DESCRIPTION OF EMBODIMENTS

Figure 1:
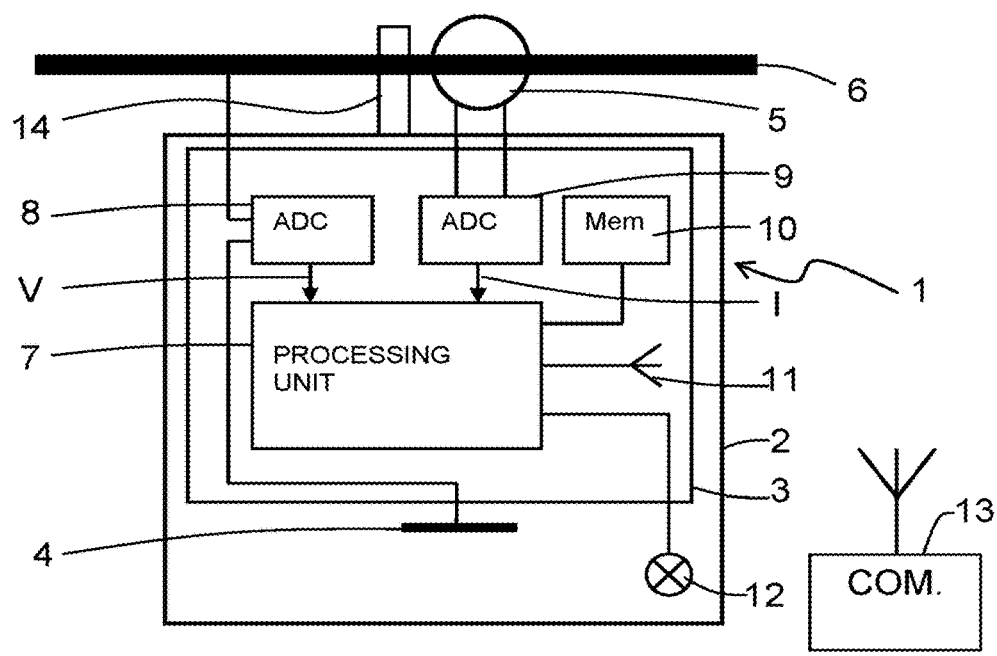
FIGS. 1 and 2 show a diagram of a monitoring device according to the prior art.
Figure 2:
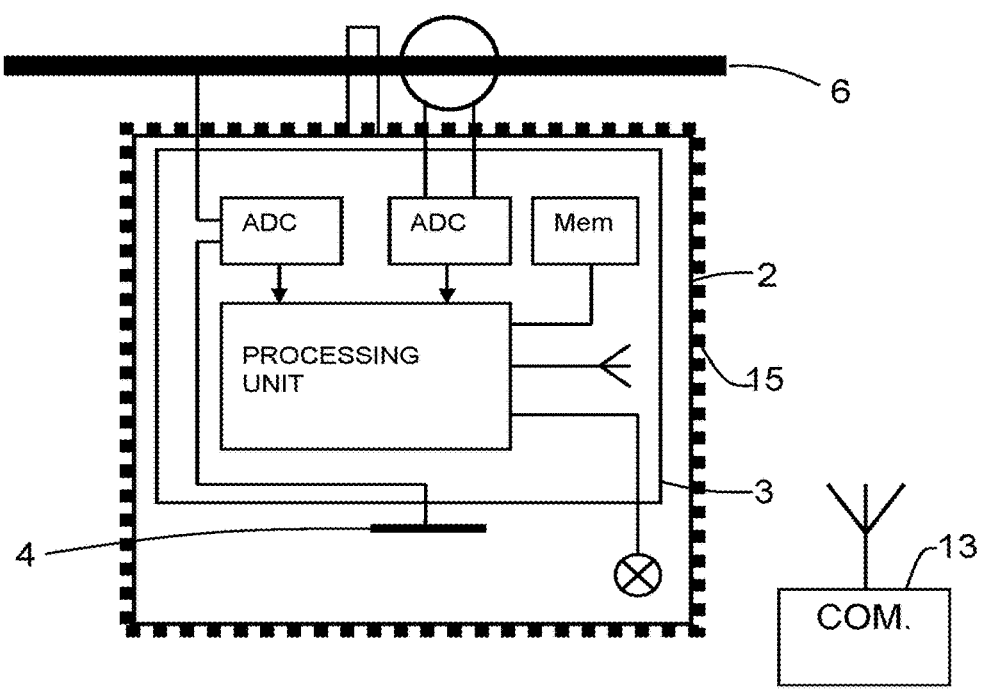
Figure 3:
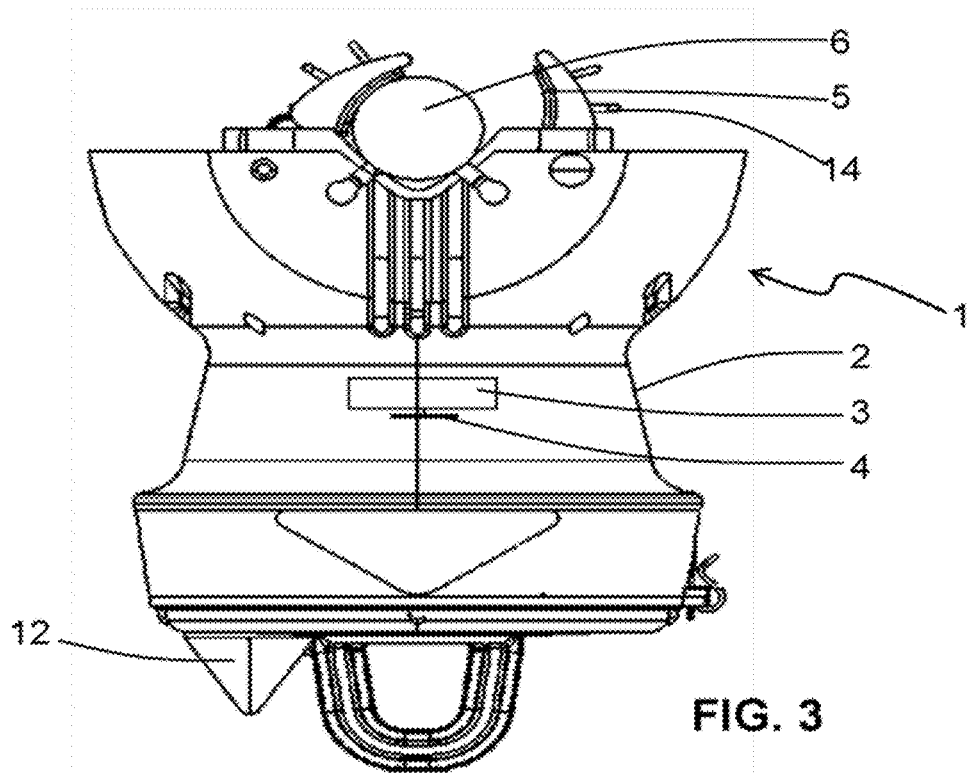
FIGS. 3 and 4 show drawings of monitoring devices in which protection devices in accordance with embodiments of the invention may be arranged.
Figure 4:
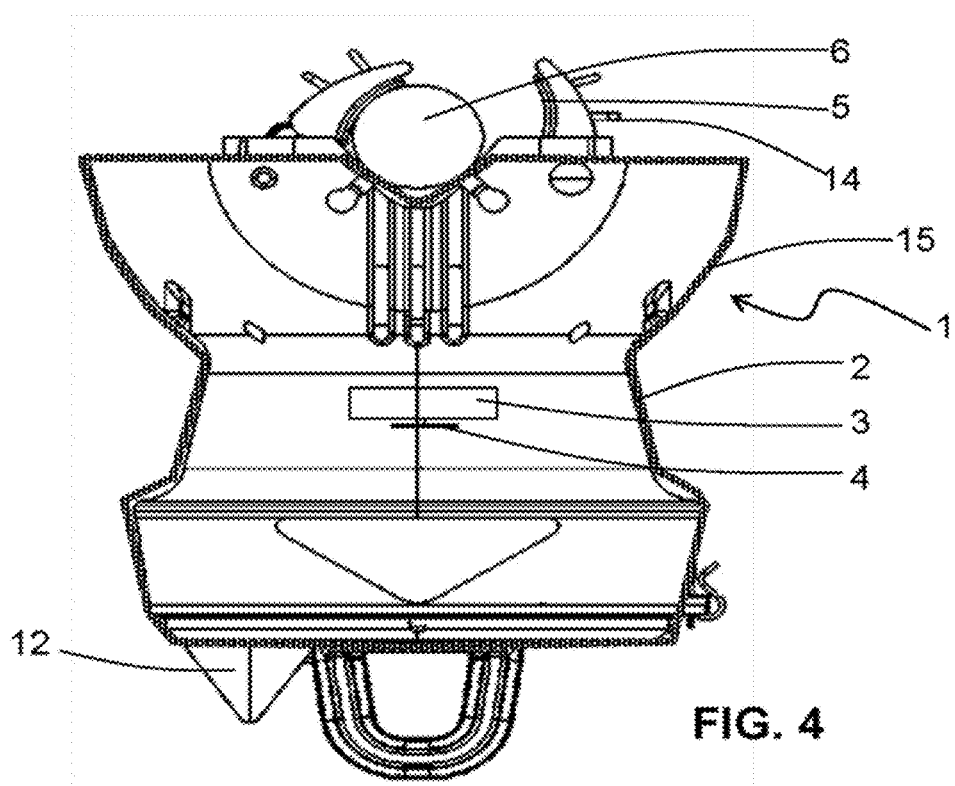

An example of the device to which the invention may be applied is shown in FIGS. 3 and 4. The monitoring device 1 is intended to be fixed to an electrical line conductor 6 and comprises a waterproof housing 2, a mechanism 5 for attaching said housing to the line conductor 6, an electronic monitoring circuit 3 and a voltage measurement sensor comprising a measurement electrode 4 connected to said electronic circuit 3.

Such a device is described in detail in French patent application number FR 15 50427 filed on 20 Jan. 2015. This application is incorporated herein by way of reference source. Another French patent application FR 14 59145 dated 26 Sep. 2014 describes a voltage measurement performed using an electrode and capacitive connection.

In FIG. 4 a film of water due to heavy rain surrounds the housing 2. Thus, when the rain increases, the water gradually forms a screen in respect of the electric field, firstly on the top face and then on the side faces. The electric field sensor of the device is thus less subject to the influence of the neighbouring lines in the case of a three-phase network. If the rain is very heavy, the film may form a closed envelope around the sensor and its bottom face. The performance characteristics of the electric field sensor are therefore impaired by its surroundings, to the point of becoming—in the worst case—ineffective.

Figure 5:
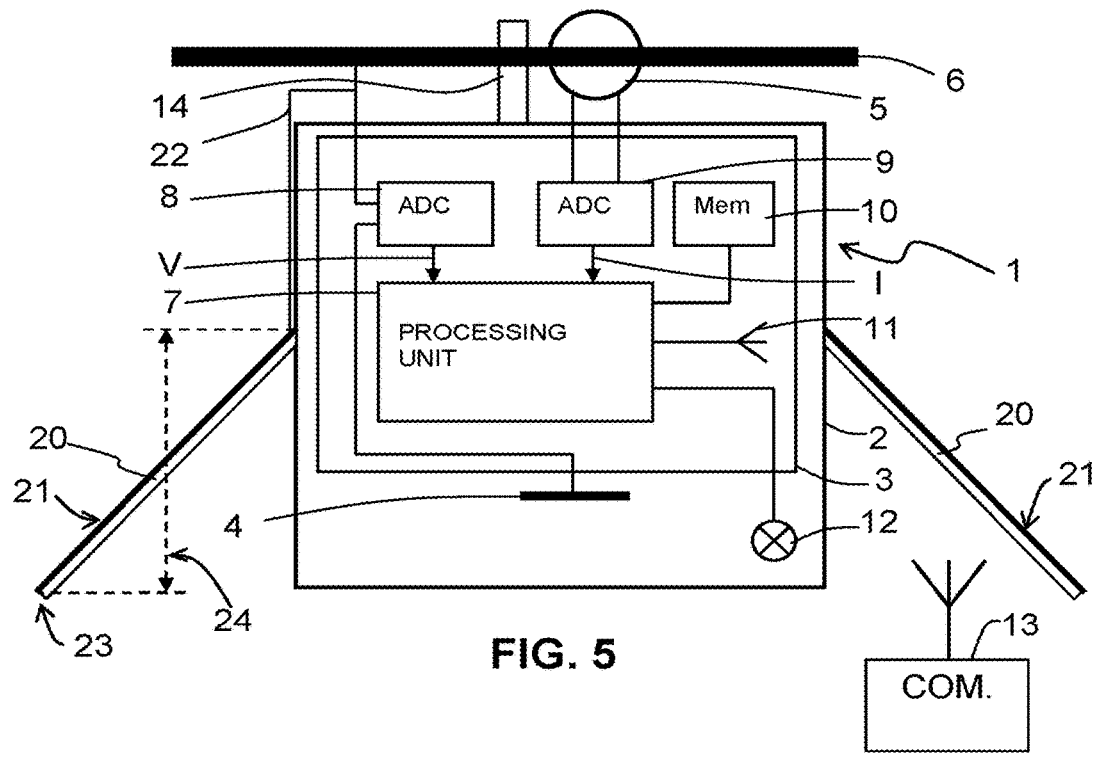
FIGS. 5 and 6 show diagrams of monitoring devices according to a first embodiment and second embodiment of the invention.

In the embodiment shown in FIG. 5, the electronic monitoring circuit 3 may also comprise an input connected to a current sensor 5. The current sensor generally comprises a current transformer composed of a magnetic circuit and a secondary winding connected to the electronic circuit 3. The magnetic circuit is intended to surround a line conductor 6 forming the primary conductor. The electronic circuit comprises a processing unit 7 receiving a voltage signal V converted by a first analog-digital converter 8 connected to the voltage electrode 4 and to the line conductor 6. The processing unit 7 may also receive a current signal I converted by a second analog-digital converter 9 connected to the current sensor 5. The monitoring device may also comprise wireless communication means with an antenna 11 and/or visual signalling means such as a remote display device 12 and a memory 10 connected to a processing unit 7 of the electronic monitoring circuit 3.

The processing unit analyzes the voltage signal V and/or the current signal I in order to detect electrical faults, calculate power or energy values and/or transmit measurement and processing values to a remote communication device 13. This device 13 may be for example a radio relay arranged on a post or pylon supporting also the overhead electrical lines.

In FIG. 5 a monitoring device according to an embodiment of the invention comprises a protection device 20 surrounding the voltage measurement electrode 4 and extending outside of the housing 2 so as to prevent the rainwater from completely covering the voltage measurement electrode 4 and/or the housing 2 containing said electrode. Said protection device 20 also comprises an electrical shielding 21 for stabilizing, around the voltage measurement electrode 4, the electric field variations due to external conditions. Preferably, the shielding 21 of the protection device is connected to the electrical potential of the conductor 6 by means of an electrical connection 22.

The protection device may be adapted to monitoring devices of the prior art. Thus, while retaining the existing mechanical elements, the voltage sensor becomes again capable of sensing the electric field in the event of bad weather or very heavy rain.

The protection device may take the form of a metal skirt surrounding the zone where the electric field sensor such as an electrode 4 is situated. In this way, the skirt of the protection device prevents the closing of a pseudo Faraday cage created by the film of water.

In this case, the skirt has an outer perimeter 23 greater than the perimeter of the housing and a height 24 greater than the height of the voltage measurement electrode. Said skirt preferably has the form of a substantially circular or frustoconical skirt.

Figures 14, 15:
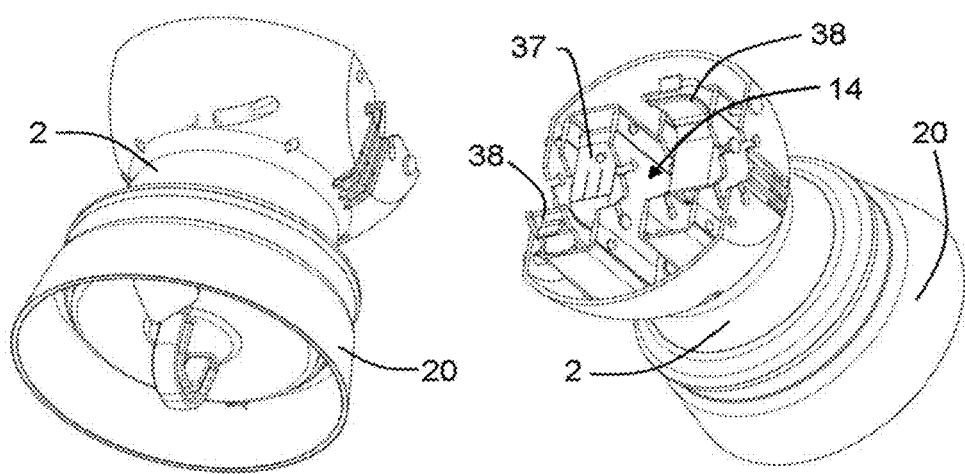
FIGS. 14 and 15 show diagrams of monitoring devices according to an embodiment of the invention.

The electrical shielding is preferably deposited by means of metal-coating of at least one part of the protection device. For example, the metal-coating may be performed by means of paint spraying. The shielding prevents the screen effect from occurring around the housing when the rain creates a film of water. Without shielding of the protection device, the field lines would be different with or without rain. Thus, with shielding or metal-coating, the field lines remain the same whatever the weather conditions. The voltage sensor is thus situated in surroundings which are stable as regards the electric field, regardless as to whether it is raining or not. In FIG. 15, the layer of rain 15 on the protection device and on its metal shielding 21 does not modify at all, or modifies very slightly, the conditions for measurement of the electric field by the sensor comprising the electrode 4. The measurement is thus more certain and more reliable.

Figure 6:
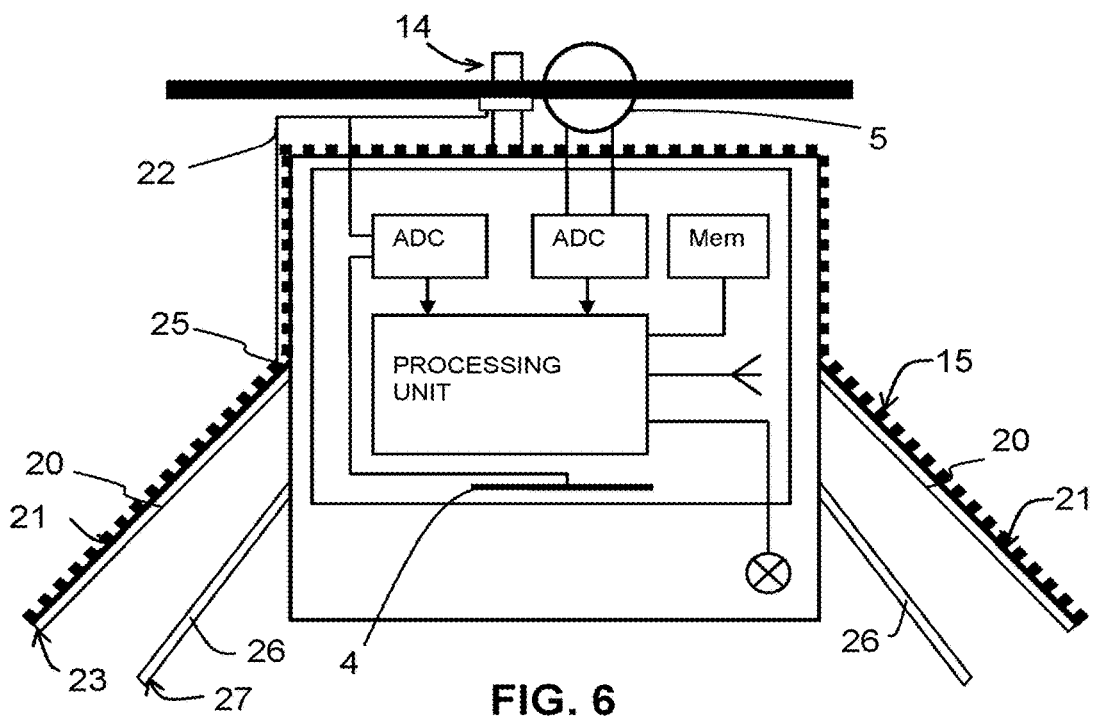
Figure 7:
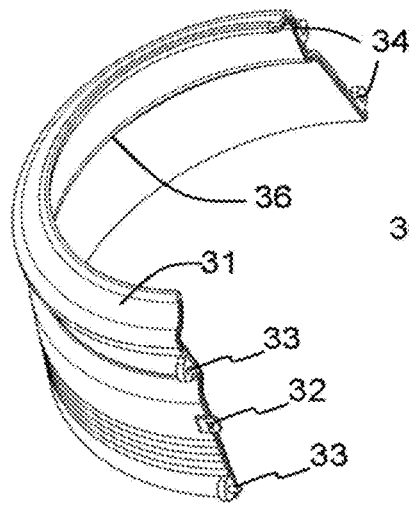
FIGS. 7, 8, 9 and 10 show views of a protection device for a monitoring device according to the invention.
Figure 8:
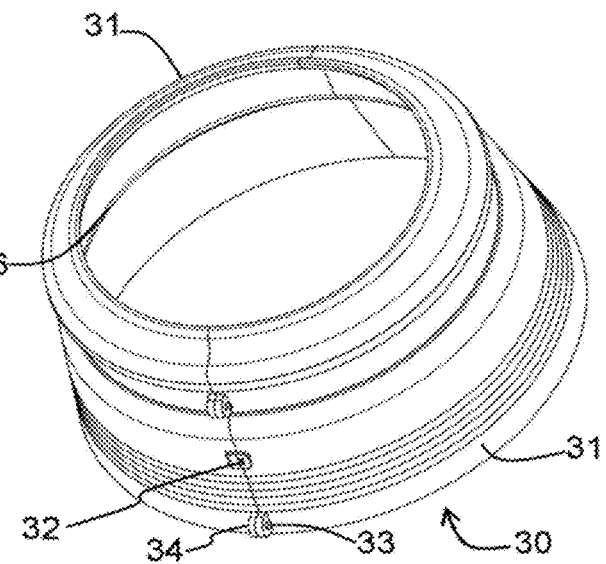
Figure 9:
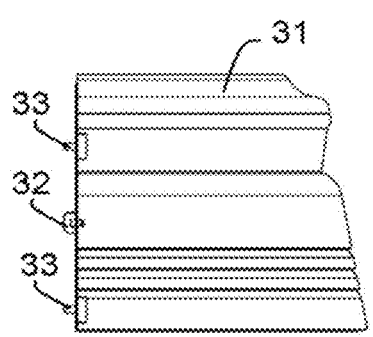

In a particular embodiment, the electrical shielding may be electrically connected to the line conductor by means of the attachment mechanism. In FIG. 6, the connection 22 connects the shielding 21 to the attachment mechanism 14 so as to be electrically connected also to the line conductor 6. These connections allow an improvement in the measurement of the electric field and consequently the electric voltage by means of a capacitive divider effect. The other input of the voltage sensor is connected to the measurement electrode arranged so as to be protected from the influence of its surroundings owing to the skirt of the protection device.

The protection device may comprise several skirts with different shapes arranged at different points on the housing. In FIG. 6, the protection device comprises:
- a first skirt 20 having a first outer perimeter 23 and a first inner perimeter 25 arranged so that the inner perimeter is situated above the position of the voltage measurement electrode 4 and the outer perimeter is situated below the position of said electrode 4, and
- a second skirt 26 arranged below the first skirt 20 and having an outer perimeter 27 smaller than that of the first skirt 20.

In the diagram shown in FIG. 6 only the first skirt is metal-coated.

FIGS. 7 to 10 show a protection device 30 consisting of two parts 31 intended to be assembled around the protective housing. Thus, the skirt 30 may be formed by two identical truncated half-cones 31 provided with clips 32, pins 33 and lugs 34 for assembly.

Figure 10:
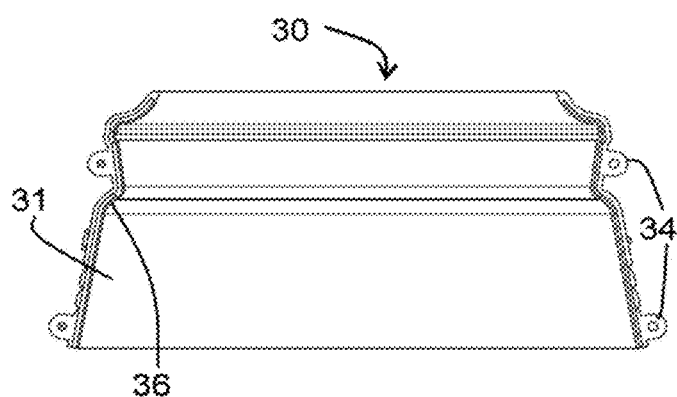
Figure 11:
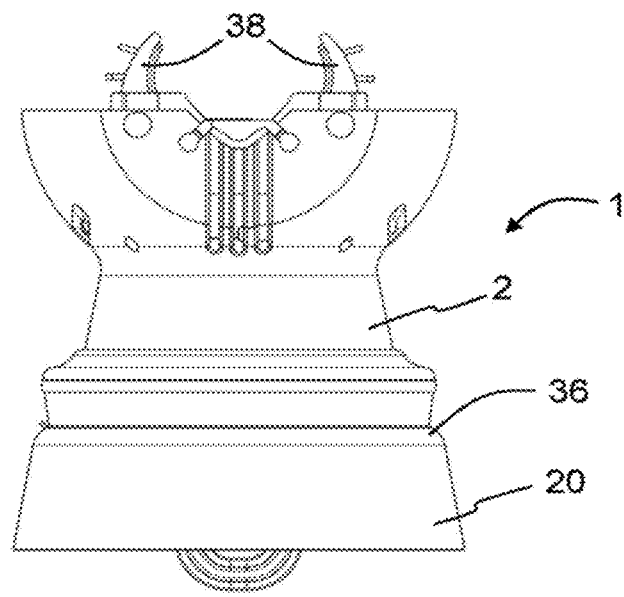
FIGS. 11 and 12 show diagrams of monitoring devices according to variations of embodiments of the invention.

The protection device comprises at least one shoulder or step 36 for preventing water from rising up inside said protection device. In FIG. 10 said shoulder is preferably at least on an internal surface 35 facing the housing 2. For example, several steps with a frustoconical form are able to prevent water from rising up due to capillarity under the effect of the wind during heavy rain falls. A monitoring device with such a skirt is shown in FIG. 11.

Figure 12:
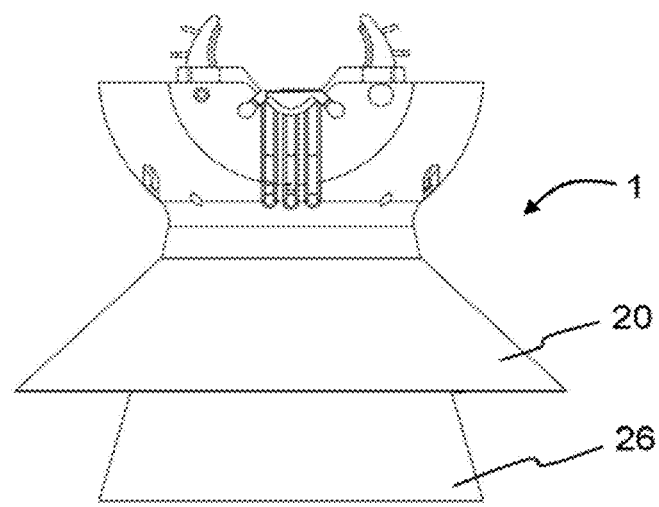

FIG. 12 shows a variant with a first skirt 20 and a second skirt 26. These other embodiments may have splay angles, or heights or perimeters of the skirt which are different, or also a different number of skirts. The shapes of the skirts are also conditioned so as to limit their exposure to being caught by the wind.

Figure 13:
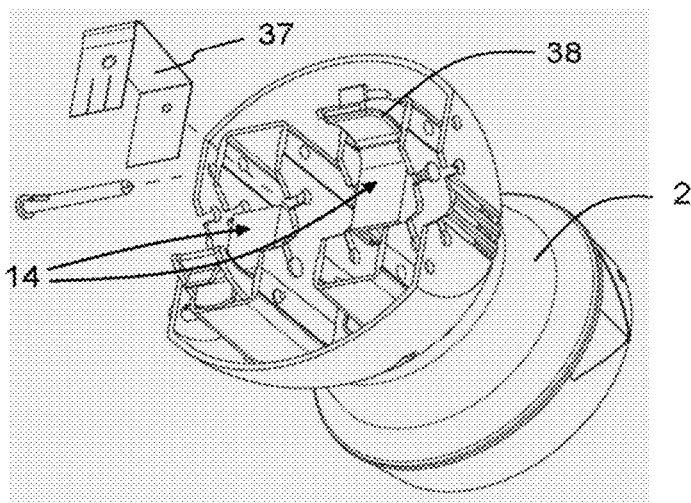
FIG. 13 shows a drawing of a monitoring device with a fixing mechanism on which a protection device according to an embodiment of the invention may be installed.

FIG. 13 shows a monitoring device before its protection device has been arranged in position. It comprises an electrical connection element 37 such as a metal plate allowing the voltage sensor to be set to the electric potential of the conductor cable 6. The element 37 is associated with the mechanism 14 comprising fixing jaws 38.

Optionally the monitoring device comprises a current measurement sensor 5 comprising a magnetic circuit and a secondary winding connected to the processing circuit, said magnetic circuit being able to be associated with the mechanism for attaching the housing to the line conductor. Thus the attachment mechanism 14 is associated with the current sensor and has the voltage socket connection for the voltage measurement. FIGS. 14 and 15 show a monitoring device fitted with a metal-coated protective skirt 20 and with the electrical connection element 37.

An electrical installation such as a medium-voltage or high-voltage distribution network comprises at least one line conductor 6, at least one monitoring device 1 arranged on said line conductor 6 and, optionally, a wireless communication device 13 communicating with said monitoring device. According to an embodiment of the invention, the monitoring device is a monitoring device comprising a protection device such as that described above intended to communicate with said communication device.

The monitoring device described above is intended in particular for medium-voltage or high-voltage networks, although it may also be used on very high or low voltage networks.

The invention claimed is:

1. A monitoring device intended to be arranged on an electrical line conductor and comprising:
    a protective housing;
    a mechanism for attaching said housing to the line conductor such that the protective housing is disposed below the line conductor;
    an electronic monitoring circuit disposed within the protective housing;
    a voltage measurement sensor, disposed within the protective housing, comprising a measurement electrode connected to said electronic monitoring circuit; and
    a protection device surrounding the voltage measurement electrode and extending externally to the protective housing to prevent rainwater from completely covering the voltage measurement electrode and/or the housing containing said electrode, said protection device comprising an electrical shielding for stabilizing, around the voltage measurement electrode, the electric field variations due to external conditions,
    wherein
    the protection device includes at least one skirt arranged externally on the protective housing and having an outer perimeter greater than the perimeter of the housing and a height greater than the height of the voltage measurement electrode,
    the protection device fully surrounding the protective housing, and
    each of the protective housing, the voltage measurement sensor, the electronic monitoring circuitry, and the protection device being disposed completely below the line conductor.

2. The monitoring device according to claim 1, wherein the electrical shielding is deposited with a metal-coating of at least a part of the protection device.

3. The monitoring device according to claim 1, wherein the electrical shielding is configured to be electrically connected to the line conductor with the attachment mechanism.

4. The monitoring device according to claim 1, wherein the protection device has the form of a substantially circular or frustoconical skirt.

5. The monitoring device according to claim 1, wherein the protection device comprises at least one shoulder or step for preventing the water from rising up inside said protection device.

6. The monitoring device according to claim 1, wherein the protection device is formed by at least two parts intended to be assembled around the protective housing.

7. The monitoring device according to claim 1, wherein the protection device comprises at least two skirts with different shapes arranged at different points on the protective housing.

8. The monitoring device according to claim 7, wherein the protection device comprises:
    a first skirt having a first outer perimeter and a first inner perimeter arranged so that said first inner perimeter is situated above the position of the voltage measurement electrode and the first outer perimeter is situated below the position of said electrode, and
    a second skirt arranged below the first skirt and having an outer perimeter smaller than that of the first skirt.

9. The monitoring device according to claim 1, comprising a current measurement sensor comprising a magnetic circuit and a secondary winding connected to a processing circuit, said magnetic circuit being associated with the mechanism for attaching the housing to the line conductor.

10. The monitoring device according to claim 1, comprising wireless communication means and/or visual signalling means connected to a processing unit of the electronic monitoring circuit.

11. An electrical installation comprising at least one line conductor and at least one monitoring device arranged on said line conductor,
   wherein said monitoring device is a monitoring device according to claim 1.

12. The electrical installation according to claim 11, comprising at least one wireless communication device, the said monitoring device being intended to communicate with said communication device.

\* \* \* \* \*